US 11,402,199 B2

(12) United States Patent
Zhang

(10) Patent No.: US 11,402,199 B2
(45) Date of Patent: Aug. 2, 2022

(54) LASER GENERATOR, STRUCTURED LIGHT PROJECTOR, AND ELECTRONIC DEVICE

(71) Applicant: GUANGDONG OPPO MOBILE TELECOMMUNICATIONS CORP., LTD., Guangdong (CN)

(72) Inventor: Xueyong Zhang, Guangdong (CN)

(73) Assignee: GUANGDONG OPPO MOBILE TELECOMMUNICATIONS CORP., LTD., Dongguan (CN)

(*) Notice: Subject to any disclaimer, the term of this patent is extended or adjusted under 35 U.S.C. 154(b) by 0 days.

(21) Appl. No.: 16/993,377

(22) Filed: Aug. 14, 2020

(65) Prior Publication Data

US 2020/0371418 A1 Nov. 26, 2020

Related U.S. Application Data

(63) Continuation of application No. PCT/CN2019/070682, filed on Jan. 7, 2019.

(30) Foreign Application Priority Data

Mar. 12, 2018 (CN) .......................... 201810200490.8

(51) Int. Cl.
*G01B 11/25* (2006.01)
*G02B 27/42* (2006.01)
(Continued)

(52) U.S. Cl.
CPC ...... *G01B 11/2513* (2013.01); *G02B 27/4205* (2013.01); *G03B 21/2033* (2013.01);
(Continued)

(58) Field of Classification Search
CPC ............ G01B 11/2513; G02B 19/0014; G02B 19/0057; G02B 27/106; G02B 27/1093;
(Continued)

(56) References Cited

U.S. PATENT DOCUMENTS 9,273,846 B1 3/2016 Rossi et al.
10,498,109 B1* 12/2019 Tsai .......................... H01S 5/423
(Continued)

FOREIGN PATENT DOCUMENTS

CN 103309137 A 9/2013
CN 203800971 U 8/2014
(Continued)

OTHER PUBLICATIONS

Extended European Search Report for EP Application 19767946.7 dated Feb. 18, 2021. (14 pages).
(Continued)

*Primary Examiner* — Magda Cruz
(74) *Attorney, Agent, or Firm* — Young Basile Hanlon & MacFarlane, P.C.

(57) ABSTRACT

A laser generator is provided. The laser generator includes a substrate and an array of light-emitting elements. The array of light-emitting elements is arranged on the substrate. The array of light-emitting elements includes a basic array and an additional array added to the basic array. The basic array forms a basic area, and the additional array forms an additional area. The basic array includes at least three basic sub-arrays, and each basic sub-array forms a basic sub-area. The basic area includes a common area arranged in at least three basic sub-areas, and the common area is further arranged within the additional area.

16 Claims, 9 Drawing Sheets

(51) Int. Cl.
*G03B 21/20* (2006.01)
*H01S 5/183* (2006.01)
*H01S 5/42* (2006.01)
*H01S 5/00* (2006.01)

(52) U.S. Cl.
CPC .............. *H01S 5/183* (2013.01); *H01S 5/423* (2013.01); *H01S 5/005* (2013.01)

(58) Field of Classification Search
CPC .. G02B 27/4205; G02B 27/425; G03B 21/00; G03B 21/2033; G06K 9/209; H01S 5/183; H01S 5/18305; H01S 5/423; H01S 5/005; H04N 13/271
See application file for complete search history.

(56) References Cited

U.S. PATENT DOCUMENTS

| | | | |
|---|---|---|---|
| 2008/0130144 A1 | 6/2008 | Chang | |
| 2014/0009580 A1 | 1/2014 | Yu et al. | |
| 2014/0029287 A1 | 1/2014 | Anzai et al. | |
| 2015/0260830 A1 | 9/2015 | Ghosh et al. | |
| 2015/0316368 A1* | 11/2015 | Moench | G01B 11/254 348/46 |
| 2016/0025993 A1* | 1/2016 | Mor | G02B 27/4205 362/259 |
| 2016/0197452 A1 | 7/2016 | Mor | |
| 2018/0231373 A1* | 8/2018 | Pesach | G02B 27/1086 |
| 2018/0292200 A1* | 10/2018 | Mor | G02B 27/1093 |
| 2019/0273905 A1* | 9/2019 | Wang | H01S 5/04256 |
| 2019/0273906 A1* | 9/2019 | Xiao | G02B 27/48 |

FOREIGN PATENT DOCUMENTS

| | | | | |
|---|---|---|---|---|
| CN | 204287691 U | 4/2015 | | |
| CN | 105120017 A | 12/2015 | | |
| CN | 205490686 U | 8/2016 | | |
| CN | 205507184 U | 8/2016 | | |
| CN | 107026392 A | 8/2017 | | |
| CN | 107039885 A | 8/2017 | | |
| CN | 206532072 U | 9/2017 | | |
| CN | 206805630 U | 12/2017 | | |
| CN | 108387365 A | * 8/2018 | ............ | G01M 11/00 |
| CN | 108493767 A | 9/2018 | | |
| CN | 108563032 A | * 9/2018 | ............ | G02B 27/30 |
| JP | 2008113060 A | 5/2008 | | |

OTHER PUBLICATIONS

English translation of ISR for PCT application PCTCN 2019070682 dated Jan. 4, 2019.
English translation of OA for CN application 201810200490.8 dated Apr. 24, 2019.
English translation of Notification of Registration 201810200490.8 dated Aug. 20, 2019.
Indian Examination Report for IN Application 202017035794 dated Jan. 17, 2022. (5 pages).

* cited by examiner

LASER GENERATOR, STRUCTURED LIGHT PROJECTOR, AND ELECTRONIC DEVICE

CROSS-REFERENCE TO RELATED APPLICATION(S)

The present application is a continuation of International Application PCT/CN2019/070682, filed on Jan. 7, 2019, which claims priority to Chinese Patent Application No. 201810200490.8, filed on Mar. 12, 2018, the entire contents of both of which are incorporated herein by reference.

TECHNICAL FIELD

The present disclosure relates to a field of optics and electronic technology, and more particularly to a laser generator, a structured light projector, and an electronic device.

BACKGROUND

In 3D imaging, an acquirer may acquire a speckle pattern emitted from a structured light projector, and then the speckle pattern is further processed by a processor for imaging. In order to improve the precision and accuracy of imaging, the speckle pattern emitted from the laser projector is required to have a high local irrelevance.

SUMMARY

Embodiments of the present disclosure provide a laser generator, a structured light projector, and an electronic device.

The laser generator according to a first aspect of embodiments of the present disclosure includes a substrate, and an array of light-emitting elements arranged on the substrate. The array of light-emitting elements includes a basic array and an additional array added to the basic array, the basic array forms a basic area, and the additional array forms an additional area. The basic array includes at least three basic sub-arrays, and each basic sub-array forms a basic sub-area. The basic area includes a common area arranged in at least three basic sub-areas, and the common area is further arranged within the additional area.

The structured light projector according to a second aspect of embodiments of the present disclosure includes a base plate assembly and a laser generator, and the laser generator is arranged on the base plate assembly. The laser generator includes a substrate, and an array of light-emitting elements arranged on the substrate. The array of light-emitting elements includes a basic array and an additional array added to the basic array, the basic array forms a basic area, and the additional array forms an additional area. The basic array includes at least three basic sub-arrays, and each basic sub-array forms a basic sub-area. The basic area includes a common area arranged in at least three basic sub-areas, and the common area is further arranged within the additional area.

The electronic device according to a third aspect of embodiments of the present disclosure includes a housing and an image acquisition structure, and the image acquisition structure is arranged in the housing and exposed out of the housing to acquire a depth image. The image acquisition structure includes a structured light projector, an image acquirer and a processor connected with the structured light projector and the image acquirer, respectively. The structured light projector is configured to emit a laser pattern out. The image acquirer is configured to acquire the laser pattern. The processor is configured to process the laser pattern to obtain a depth image. The laser generator includes a base plate assembly and a laser generator, and the laser generator is arranged on the base plate assembly. The laser generator includes a substrate, and an array of light-emitting elements arranged on the substrate. The array of light-emitting elements includes a basic array and an additional array added to the basic array, the basic array forms a basic area, and the additional array forms an additional area. The basic array includes at least three basic sub-arrays, and each basic sub-array forms a basic sub-area. The basic area includes a common area arranged in at least three basic sub-areas, and the common area is further arranged within the additional area.

Additional aspects and advantages of the embodiments of present disclosure will be given in part in the following descriptions, become apparent in part from the following descriptions, or be learned from the practice of the embodiments of the present disclosure.

BRIEF DESCRIPTION OF DRAWINGS

These and other aspects and advantages of the embodiments of the present disclosure will become apparent and readily appreciated from the following descriptions made with reference to the drawings.

DETAILED DESCRIPTION

Figure 1:
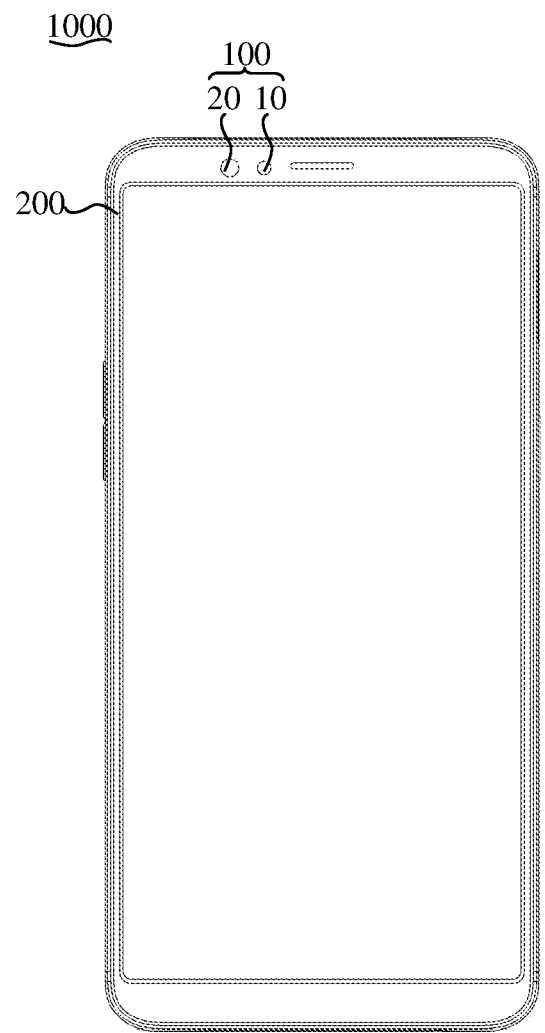
FIG. 1 is a schematic view of an electronic device according to an embodiment of the present disclosure.

Embodiments of the present disclosure are further described with reference to the accompanying drawings. Same or similar reference signs represent the same or similar components or components that have the same or similar functions from beginning to end.

Moreover, the embodiments described below with reference to the accompanying drawings are examples, are merely used to explain the present disclosure, and cannot be construed as a limitation to the present disclosure.

In the descriptions of the present disclosure, it may be noted that, unless otherwise expressly specified and limited, the first feature "on" or "under" the second feature may be that the first and second features are in direct contact, or that the first and second features are in indirect contact through an intermediate medium. Moreover, the first feature "up", "above" and "on" the second feature may be that the first feature is directly above or obliquely above the second feature, or merely be that the first feature has a level higher than the second feature. The first feature "down", "below" and "under" the second feature may be that the first feature is directly below or obliquely below the second feature, or merely be that the first feature has a level lower than the second feature.

A laser generator 13 according to an embodiment of the present disclosure includes a substrate 131 and an array of light-emitting elements 132 arranged on the substrate 131. The array of light-emitting elements 132 includes a basic array 133 and an additional array 134 added to the basic array 133, the basic array 133 forms a basic area A, and the additional array 134 forms an additional area C. The basic array 133 includes at least three basic sub-arrays 1331, and each basic sub-array 1331 forms a basic sub-area a. The basic area A has a common area B arranged in at least three basic sub-areas a, and the common area B is further arranged within the additional area C.

In some embodiments, the at least three basic sub-arrays 1331 are identical, and the additional array 134 is the same with the basic sub-arrays 1331.

In some embodiments, the at least three basic sub-arrays 1331 are identical, and the additional array 134 is generated by the basic sub-array 1331 by means of transformation, and the transformation includes one of rotation, mirror and zoom or a combination of more than one of rotation, mirror and zoom.

In some embodiments, the at least three basic sub-arrays 1331 and the additional array 134 may be generated by any one of the at least three basic sub-arrays 1331 by means of transformation, and the transformation includes one of rotation, mirror and zoom or a combination of more than one of rotation, mirror and zoom.

In some embodiments, the light-emitting elements 132 of the basic sub-array 1331 are regularly or irregularly distributed.

In some embodiments, the additional array 134 and each basic sub-array 1331 may be separately driven to emit light.

A structured light projector 10 according to an embodiment of the present disclosure includes a base plate assembly 11 and the laser generator 13 according to any one of the above embodiments, and the laser generator 13 is arranged on the base plate assembly 11.

In some embodiments, the structured light projector 10 further includes a lens barrel 12, a collimation element 14, and a diffractive optical element 15. The lens barrel 12 includes a lens-barrel side wall 122 arranged on the base plate assembly 11 and defining an accommodating chamber 121 together with the base plate assembly 11. The collimation element 14 is accommodated in the accommodating chamber 121, the diffractive optical element 15 is accommodated in the accommodating chamber 121, the laser generator 13 is configured to emit laser into the accommodating chamber 121, and the collimation element 14 and the diffractive optical element 15 are sequentially arranged in a light path of the laser generator 13.

In some embodiments, the lens barrel 12 includes a position limiting protrusion 123 protruding from the lens-barrel side wall 122 into the accommodating chamber 121, and the diffractive optical element 15 is mounted on the position limiting protrusion 123. The structured light projector 10 further includes a protective cover 16, the protective cover 16 is joined to the lens barrel 12 and includes a protective top wall 161, and the diffractive optical element 15 is arranged between the position limiting protrusion 123 and the protective top wall 161.

In some embodiments, the protective cover 16 further includes a protective side wall 162 extending from the protective top wall 161. The protective cover 16 covers the lens barrel 12. The protective side wall 162 is fixedly connected with the lens-barrel side wall 122, and an adhesive receiving groove 126 is formed in an outer face of the lens-barrel side wall 122. The protective side wall 162 is provided with an adhesive dispensing hole 163 in a position corresponding to the adhesive receiving groove 126 to allow an adhesive to enter the adhesive receiving groove 126 through the adhesive dispensing hole 163.

An image acquisition structure 100 according to an embodiment of the present disclosure includes the structured light projector 10 according to any one of the above embodiments, an image acquirer 20 and a processor 30 connected with the structured light projector 10 and the image acquirer 20, respectively. The structured light projector 10 is configured to emit a laser pattern out, the image acquirer 20 is configured to acquire the laser pattern, and the processor 30 is configured to process the laser pattern to obtain a depth image.

An electronic device 1000 according to an embodiment of the present disclosure includes a housing 200 and the image acquisition structure 100 according to the above embodiments. The image acquisition structure 100 is arranged in the housing 200 and exposed out of the housing 200 to acquire a depth image.

As illustrated in FIG. 1, an electronic device 1000 according to embodiments of the present disclosure includes a housing 200 and an image acquisition structure 100. The electronic device 1000 may be a mobile phone, a tablet computer, a laptop computer, a game machine, a head-mounted display device, an access control system, a teller machine, etc. The embodiments of the present disclosure are illustrated by taking an example that the electronic device 1000 is a mobile phone. It may be understood that the electronic device 1000 may have other specific forms, which is not limited herein. The image acquisition structure 100 is arranged in the housing 200 and exposed out of the housing 200 to acquire a depth image. The housing 200 can provide the image acquisition structure 100 with protection against dust, water, drop, etc., and the housing 200 is provided with a hole therein corresponding to the image acquisition structure 100 to allow light to pass through the hole out of or into the housing 200.

Figure 2:
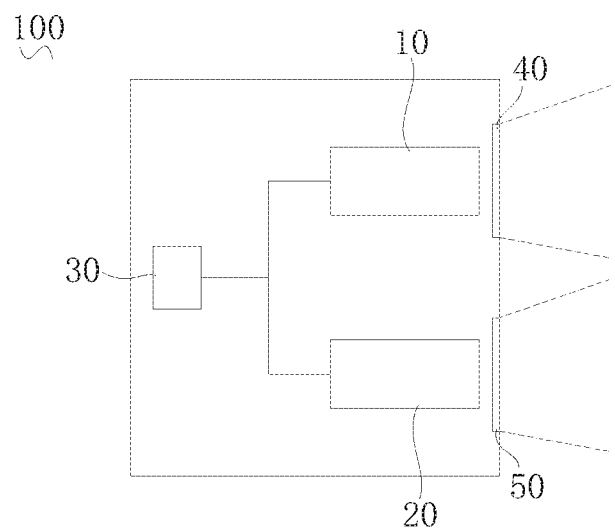
FIG. 2 is a schematic view of an image acquisition structure according to an embodiment of the present disclosure.

As illustrated in FIG. 2, the image acquisition structure 100 includes a structured light projector 10, an image acquirer 20, and a processor 30. A projection window 40 that corresponds to the structured light projector 10 and an acquisition window 50 that corresponds to the image acquirer 20 may be formed in the image acquisition structure 100. The structured light projector 10 is configured to project a laser pattern to a target space through the projection window 40. The image acquirer 20 is configured to acquire the laser pattern modulated by a target object through the acquisition window 50. In an embodiment, the laser projected by the structured light projector 10 is infrared light, and the image acquirer 20 is an infrared camera. The processor 30 is connected to both of the structured light projector 10 and the image acquirer 20, and is configured to process the laser pattern to obtain the depth image. In some embodiments, the processor 30 calculates a deviation value between each pixel point in the laser pattern and a corresponding pixel point in a reference pattern with an image matching algorithm, and then acquires the depth image of the laser pattern based on the deviation value. The image matching algorithm may be a digital image correlation (DIC) algorithm. Certainly, other image matching algorithms may be adopted to replace the DIC algorithm. The structure of the structured light projector 10 will be further described below.

Figure 3:
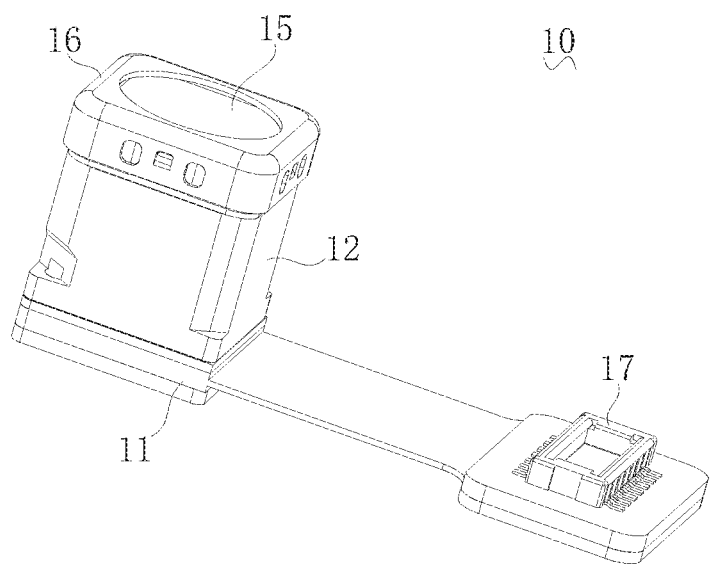
FIG. 3 is a perspective view of a structured light projector according to an embodiment of the present disclosure.
Figure 4:
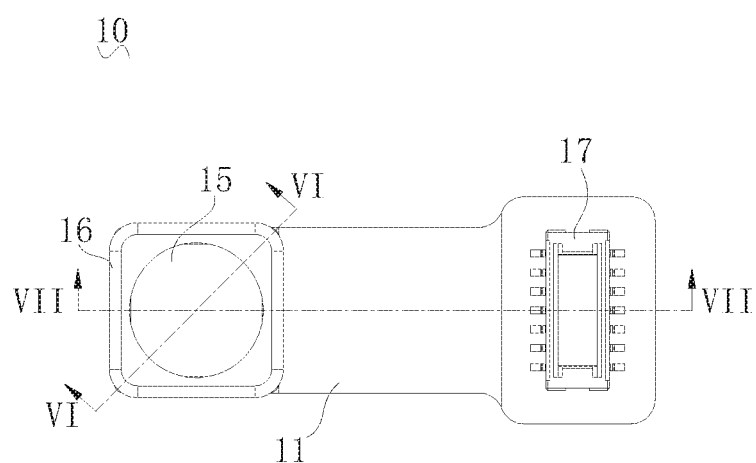
FIG. 4 is a plan view of a structured light projector according to an embodiment of the present disclosure.
Figure 5:
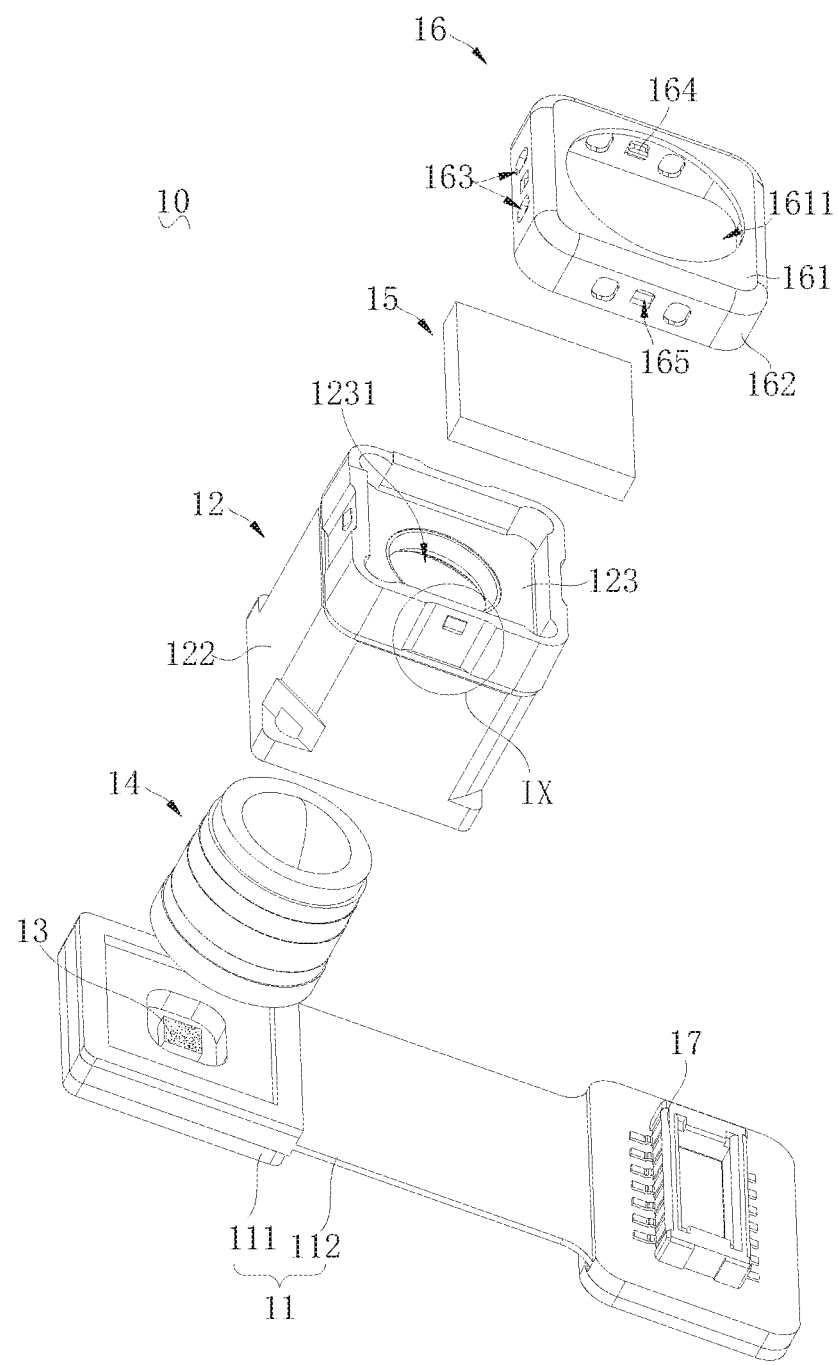
FIG. 5 is an exploded perspective view of a structured light projector according to an embodiment of the present disclosure.

As illustrated in FIGS. 3 to 5, the structured light projector 10 includes a base plate assembly 11, a lens barrel 12, a laser generator 13, a collimation element 14, a diffractive optical element (DOE) 15, and a protective cover 16. The collimation element 14 and the diffractive optical element 15 are sequentially arranged in a light path of the laser generator 13. In some embodiments, the light emitted from the laser generator 13 sequentially passes through the collimation element 14 and the diffractive optical element 15.

Figure 6:
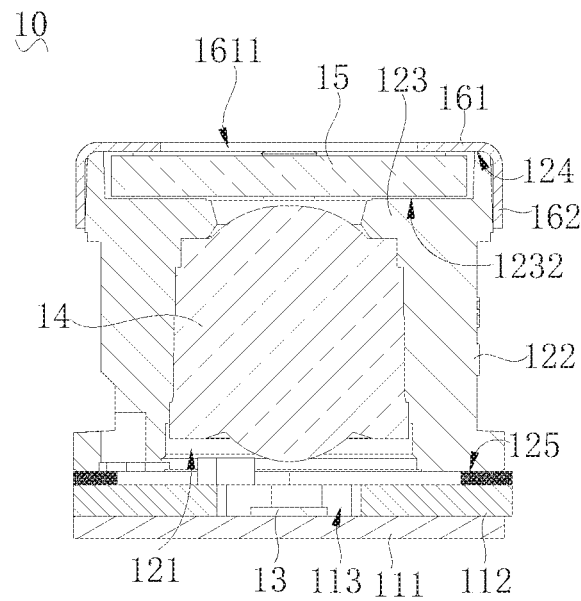
FIG. 6 is a sectional view of the structured light projector taken along line VI-VI in FIG. 4.
Figure 7:
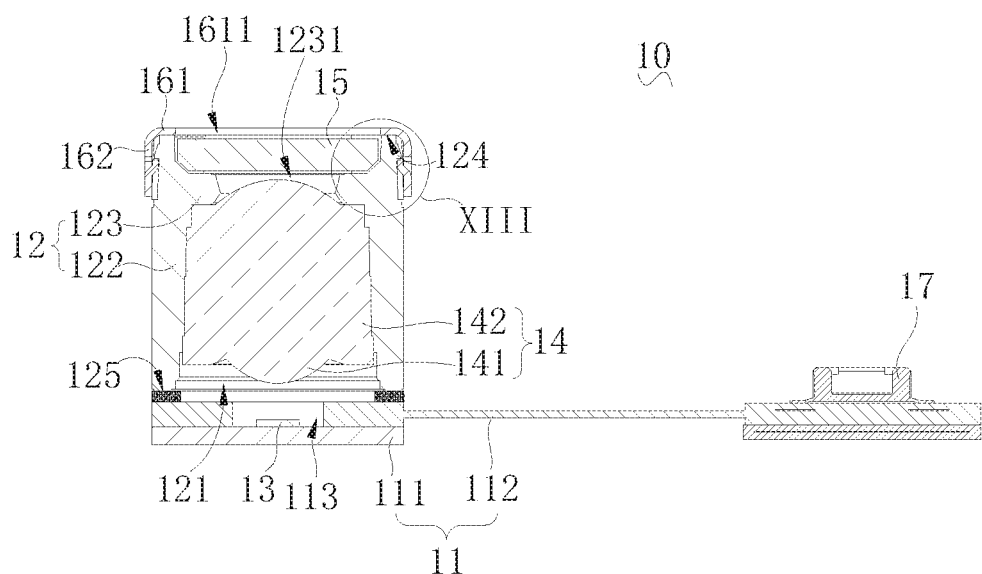
FIG. 7 is a sectional view of the structured light projector taken along line VII-VII in FIG. 4.

As illustrated in FIGS. 5 to 7, the base plate assembly 11 includes a base plate 111 and a circuit board 112 carried on the base plate 111. The base plate 111 is configured to carry the lens barrel 12, the laser generator 13 and the circuit board 112. The material of the base plate 111 may be plastic, such as at least one of polyethylene glycol terephthalate (PET), polymethyl methacrylate (PMMA), polycarbonate (PC), and polyimide (PI). That is, the base plate 111 may be made of a single plastic material of any one of PET, PMMA, PC and PI. As such, the base plate 111 is light in weight and has sufficient support strength.

The circuit board 112 may be any one of a printed circuit board, a flexible circuit board, and a rigid-flex circuit board. The circuit board 112 may be provided with a via hole 113, and the via hole 113 may be configured for accommodating the laser generator 13 therein. A part of the circuit board 112 is covered by the lens barrel 12, and another part of the circuit board 112 extends out to be connected to a connector 17. The connector 17 may connect the structured light projector 10 to a main board of the electronic device 1000.

As illustrated in FIGS. 6 and 7, the lens barrel 12 is arranged on the base plate assembly 11 and defines an accommodating chamber 121 together with the base plate assembly 11. In some embodiments, the lens barrel 12 may be connected to the circuit board 112 of the base plate assembly 11. The lens barrel 12 and the circuit board 112 may be bonded by adhesive to improve airtightness of the accommodating chamber 121. Certainly, the lens barrel 12 and the base plate assembly 11 may be connected in other specific connection manners, for example, through a snap connection. The accommodating chamber 121 is configured to accommodate components such as the collimation element 14 and the diffractive optical element 15, and the accommodating chamber 121 also serves as a part of the light path of the structured light projector 10. In the embodiments of the present disclosure, the lens barrel 12 has a hollow cylindrical shape, and the lens barrel 12 includes a lens-barrel side wall 122 and a position limiting protrusion 123.

Figure 8:
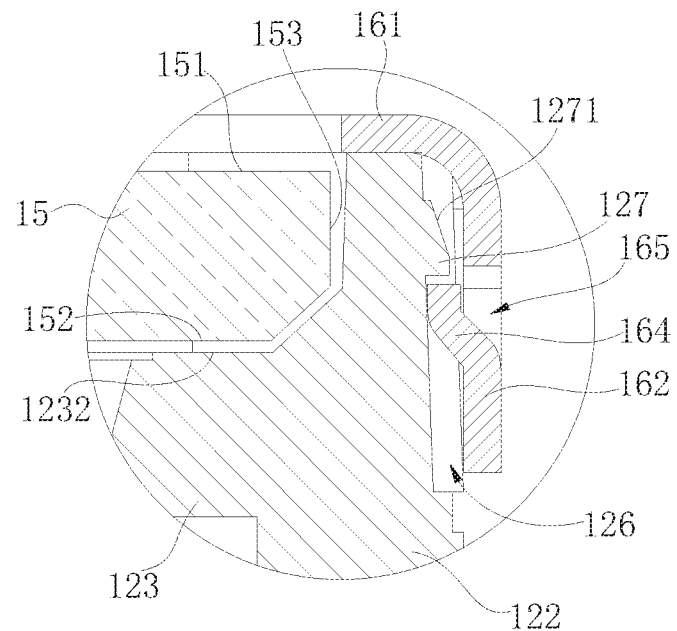
FIG. 8 is an enlarged view of a part XIII of the structured light projector in FIG. 7.
Figure 9:
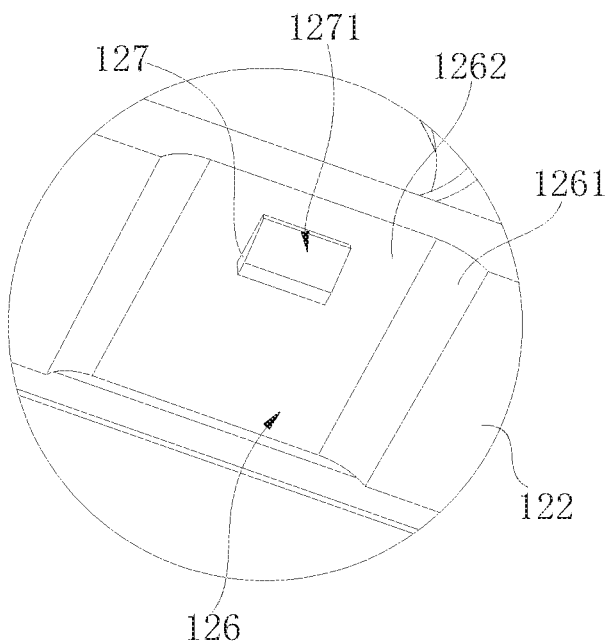
FIG. 9 is an enlarged view of a part IX of the structured light projector in FIG. 5.

The lens-barrel side wall 122 encloses the accommodating chamber 121, and an outer face of the lens-barrel side wall 122 may be provided with a positioning structure and a mounting structure to fix a position of the structured light projector 10 when the structured light projector 10 is mounted in the electronic device 1000. The lens barrel 12 includes a first face 124 and a second face 125 facing away each other, an opening of the accommodating chamber 121 is formed in the second face 125 and another opening thereof is formed in the first face 124. The second face 125 is bonded with the circuit board 112, for example, being glued to the circuit board 112. The first face 124 may serve as a joint face of the lens barrel 12 with the protective cover 16. As illustrated in FIGS. 8 and 9, an adhesive receiving groove 126 is formed in the outer face of the lens-barrel side wall 122, and the adhesive receiving groove 126 may be formed from the first face 124 and extend towards the second face 125.

As illustrated in FIGS. 6 and 7, the position limiting protrusion 123 protrudes inwardly from the lens-barrel side wall 122. In some embodiments, the position limiting protrusion 123 protrudes from the lens-barrel side wall 122 into the accommodating chamber 121. The position limiting protrusion 123 may have a continuous ring shape. Or, a plurality of the position limiting protrusions 123 may be provided. The plurality of the position limiting protrusions 123 are spaced apart from one another. The position limiting protrusion 123 encloses a light passing hole 1231. The light passing hole 1231 serves as a part of the accommodating chamber 121. The laser passes through the light passing hole 1231 and then enters the diffractive optical element 15. The position limiting protrusion 123 is arranged between the first face 124 and the second face 125. A part of the accommodating chamber 121 between the position limiting protrusion 123 and the second face 125 is configured to accommodate the collimation element 14, and another part of the accommodating chamber 121 between the position limiting protrusion 123 and the first face 124 is configured to accommodate the diffractive optical element 15. During the assembling of the structured light projector 10, when the diffractive optical element 15 abuts against the position limiting protrusion 123, the diffractive optical element 15 may be considered to be mounted in place. When the collimation element 14 abuts against the position limiting protrusion 123, the collimation element 20 may be considered to be mounted in place. The position limiting protrusion 123 includes a position limiting face 1232, and the position limiting face 1232 is joined with the diffractive optical element 15 when the diffractive optical element 15 is mounted on the position limiting protrusion 123.

Figure 11:
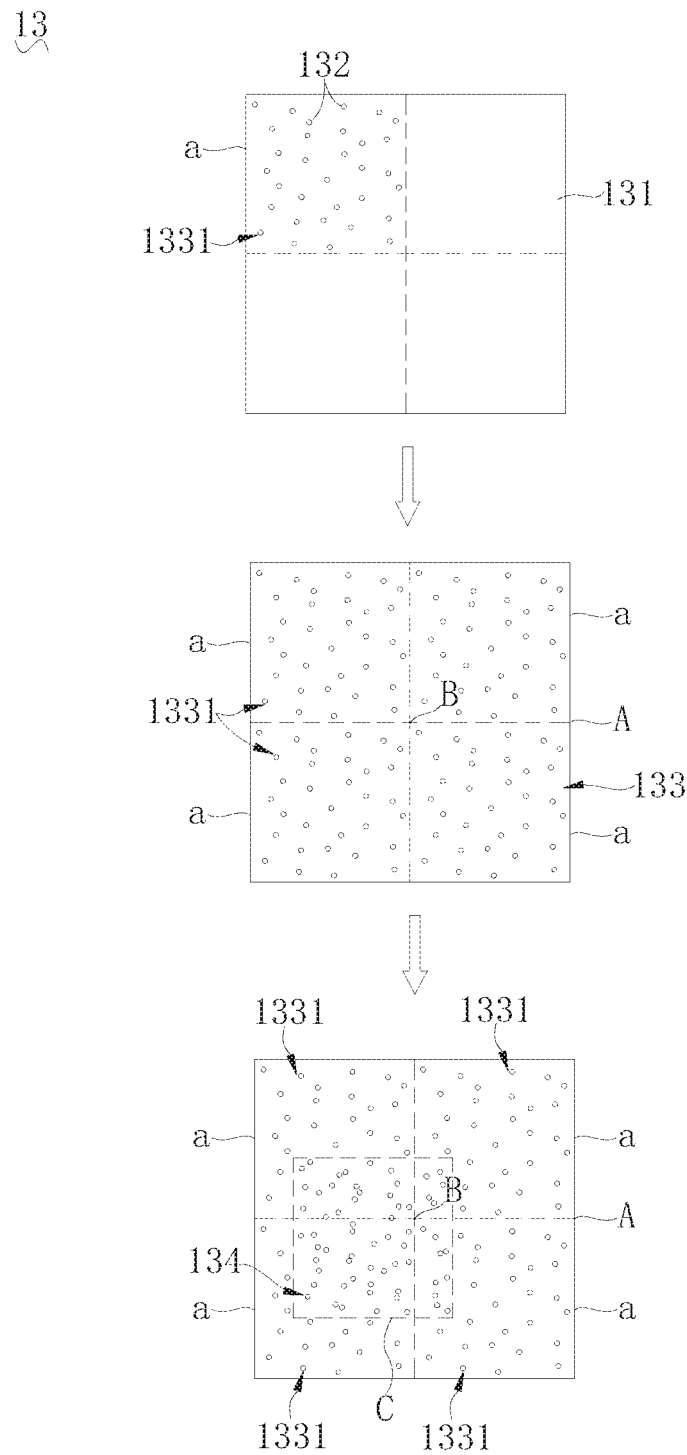
FIGS. 11 to 14 are schematic views of a laser generator of a structured light projector according to embodiments of the present disclosure.

As illustrated in FIG. 7, the laser generator 13 is arranged on the base plate assembly 11. In some embodiments, the laser generator 13 may be arranged on the circuit board 112 and electrically connected with the circuit board 112. The laser generator 13 may also be arranged on the base plate 111 and correspond to the via hole 113. In this case, the laser generator 13 may be electrically connected to the circuit board 112 by arranging wires. The laser generator 13 is configured to emit a laser and the laser may be visible light or invisible light, such as infrared light or ultraviolet light. As illustrated in FIG. 11, the laser generator 13 includes a substrate 131 and an array of light-emitting elements 132.

The substrate 131 may be a semiconductor substrate, such as a wafer, and the substrate 131 is mounted on the base plate assembly 11. For example, the substrate 131 is bonded with the base plate assembly 11 by gluing.

As illustrated in FIG. 11, the array of light-emitting elements 132 includes a plurality of light-emitting elements 132 arranged on the substrate 131 and configured for emitting laser out. The light-emitting element 132 may be a light source such as a vertical cavity surface emitting laser (VCSEL). The array of light-emitting elements 132 includes a basic array 133 and an additional array 134 added to the basic array 133. That is, the basic array 133 and the additional array 134 both include a plurality of light-emitting elements 132, and the light-emitting elements 132 of the additional array 134 are added among the light-emitting elements 132 of the basic array 133. The basic array 133 forms a basic area A, and the additional array 134 forms an additional area C. A plurality of the additional arrays 134 may be provided, and each additional array 134 forms an additional area C. The basic area A and the additional area C may have an overlapped area.

Figure 12:
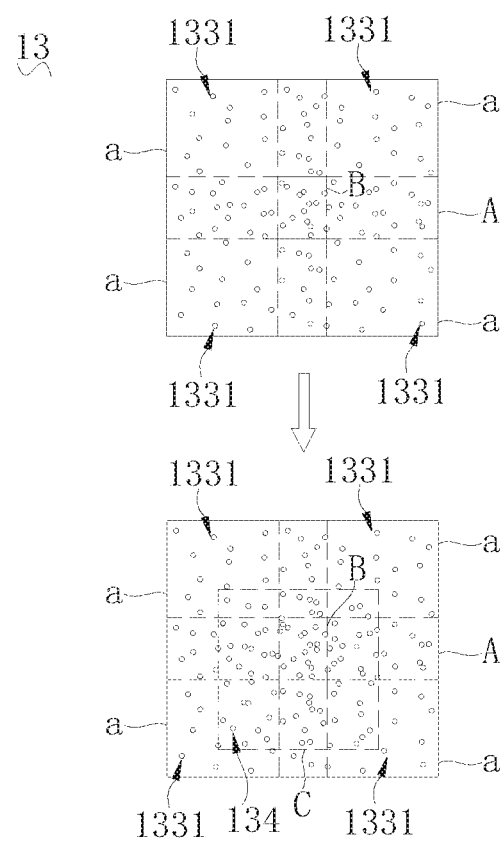
Figure 13:
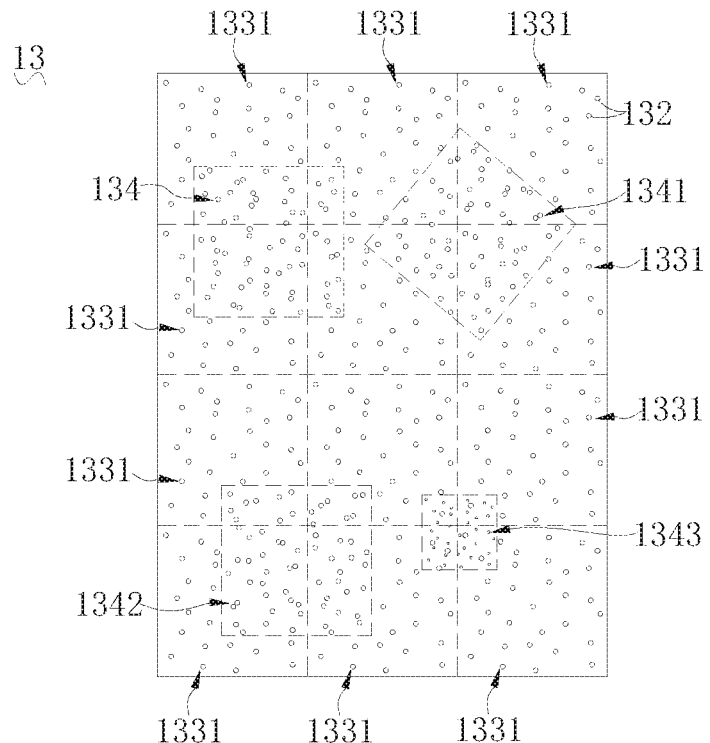
Figure 14:
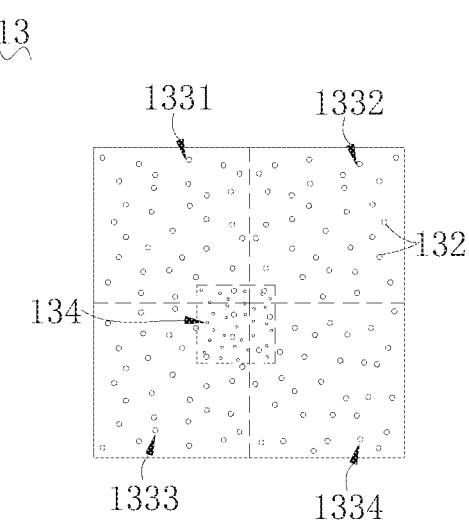

The basic array 133 includes at least three basic sub-arrays 1331, and each basic sub-array 1331 forms a basic sub-area a. Different basic sub-areas a may have an overlapped area, and the basic sub-area a is arranged in the basic area A. The basic area A further includes a common area B, and the common area B is arranged in at least three basic sub-areas a. That is, the common area B is formed by overlapping the at least three basic sub-areas a. It should be noted that "a first area being arranged in a second area" herein means that the first area is arranged inside the second area, and boundaries of the two areas overlap partially, as illustrated in FIGS. 11-14. In some embodiments, the at least three basic sub-areas a may be all the basic sub-areas a, as illustrated in FIGS. 11, 12 and 14. In some other embodiments, the at least three basic sub-areas a may be a part of all the basic sub-areas a, as illustrated in FIG. 13. The common area B may have the light-emitting element 132 or not have the light-emitting element 132 therein. The common area B may be a point, a line or a plane. In an embodiment, as illustrated in FIG. 11, the common area B is a point arranged in four basic sub-areas a simultaneously. In another example, as illustrated in FIG. 12, the common area B is a rectangular area arranged in four basic sub-areas a simultaneously. The common area B is also arranged within the additional area C. That is, a boundary of the additional area C encloses the common area B. It should be noted that "a first area being arranged within a second area" herein means that the first area is arranged inside the second area, and boundaries of the two areas do not overlap at all, as illustrated in FIGS. 11-14. It may be understood that the common area B is arranged in the at least three basic sub-areas a and within the additional area C simultaneously. That is, an overlapped part is formed between each additional area C and the at least three basic sub-areas. Correspondingly, each additional array 134 overlaps the at least three basic sub-areas a, thus improving a local irrelevance of the array of light-emitting elements 132. For example, as illustrated in FIG. 11, the additional area C has an overlapped part with each of the four basic sub-areas a, that is, the additional array 134 overlaps each of the four basic sub-arrays 1331, and arrays formed by the overlapped parts of the additional array 134 with different basic sub-arrays 1331 are different. Thus, the local irrelevance of the array of light-emitting elements 132 is significantly improved.

It may be noted that in the drawings of the embodiments of the present disclosure, each circle represents a position of the light-emitting element 132 rather than an actual shape and size of the light-emitting element 132. The solid block represents a profile of the substrate 131. The dashed block is used to assist in representing a boundary of each area and does not necessarily exist in the laser generator 13. A specific arrangement of the light-emitting elements 132 in the basic sub-array 1331, a combination mode of the basic sub-areas a, and specific shapes of the basic sub-area a and the additional area C are merely used for illustrative purposes and cannot be construed as a limitation to the present disclosure. As illustrated in FIG. 11, when the laser generator 13 is manufactured, the basic array 133 may be manufactured on the substrate 131 first. In some embodiments, the basic sub-arrays 1331 may be manufactured on the substrate 131 one by one. After the manufacturing of all the basic sub-arrays 1331 is finished, the common area B is thus generated. Then, the additional array 134 is manufactured, the additional area C is thus generated, and the common area B is arranged within the additional area C.

As illustrated in FIG. 7, the collimation element 14 may be an optical lens and is configured to collimate the laser emitted from the laser generator 13. The collimation element 14 is accommodated in the accommodating chamber 121. The collimation element 14 may be assembled into the accommodating chamber 121 along a direction from the second face 125 to the first face 124. The collimation element 14 includes an optical portion 141 and a mounting portion 142, and the mounting portion 142 is configured to be joined with the lens-barrel side wall 122 to fix the collimation element 14. In the embodiment of the present disclosure, the optical portion 141 includes two curved faces arranged on two sides facing away from each other of the collimation element 14.

As illustrated in FIGS. 7 and 8, the diffractive optical element 15 is mounted on the position limiting protrusion 123. In some embodiments, the diffractive optical element 15 is joined with the position limiting face 1232 so as to be mounted on the position limiting protrusion 123. The outer surface of the diffractive optical element 15 includes a top face 151, a bottom face 152 and a side face 153. The top face 151 faces away from the bottom face 152, and the side face 153 is connected to the top face 151 and the bottom face 152. When the diffractive optical element 15 is mounted on the position limiting protrusion 123, the bottom face 152 is joined with the position limiting face 1232. In the embodiment of the present disclosure, a diffractive structure is provided to the bottom face 152, the top face 151 may be a smooth face, and the diffractive optical element 15 may project the laser collimated by the collimation element 14 into the laser pattern corresponding to the diffractive structure. The diffractive optical element 15 may be made of glass, or a composite plastic such as PET.

Figure 10:
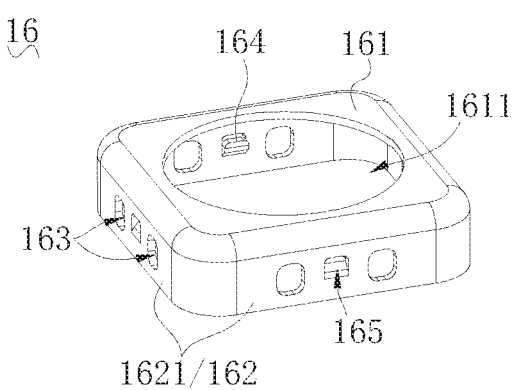
FIG. 10 is a perspective view of a protective cover of a structured light projector according to an embodiment of the present disclosure.

As illustrated in FIGS. 7 and 8, the protective cover 16 is joined with the lens barrel 12 and is configured to limit the position of the diffractive optical element 15. In some embodiments, the protective cover 16 is configured to prevent the diffractive optical element 15 from falling out of the lens barrel 12 after the joint of the diffractive optical element 15 and the lens barrel 12 fails. As illustrated in FIG. 10, the protective cover 16 includes a protective top wall 161 and a protective side wall 162.

The protective top wall 161 and the position limiting protrusion 123 are arranged on two sides facing away from each other of the diffractive optical element 15, respectively. That is, the diffractive optical element 15 is arranged between the position limiting protrusion 123 and the protective top wall 161. As such, even if the joint of the diffractive optical element 15 and the position limiting protrusion 123 fails, the diffractive optical element 15 cannot fall off due to the limiting effect of the protective top wall 161. The protective top wall 161 is provided with a light transmission hole 1611, and a position of the light transmission hole 1611 is corresponding to the diffractive optical element 15. The laser passes through the light passing hole 1231, the diffractive optical element 15 and the light transmission hole 1611 successively, and then is projected out of the structured light projector 10. In the embodiment of the present disclosure, an overall shape of the protective top wall 161 is a square shape with rounded corners, and the light transmission hole 1611 may have a circular shape, a rectangular shape, an elliptical shape, a trapezoid shape, and so on.

As illustrated in FIGS. 8 to 10, the protective side wall 162 extends from a periphery of the protective top wall 161, the protective cover 16 covers the lens barrel 12, and the protective side wall 162 is fixedly connected to the lens-barrel side wall 122. The protective side wall 162 includes a plurality of protective sub side walls 1621 connected to each other end to end sequentially, and each protective sub side wall 1621 is fixedly connected with the lens-barrel side wall 122 and is provided with an adhesive dispensing hole 163 therein. The position of the adhesive dispensing hole 163 corresponds to that of an adhesive receiving groove 126. After the protective cover 16 is covered on the lens barrel 12, the adhesive can be dispensed through the adhesive dispensing hole 163 into the adhesive receiving groove 126. After the adhesive solidifies, the protective side wall 162 is fixedly connected with the lens-barrel side wall 122. In an embodiment, each protective sub side wall 1621 is provided with a single adhesive dispensing hole 163. In another example, each protective sub side wall 1621 is provided with a plurality of adhesive dispensing holes 163, such as two, three, four, etc. In the embodiment of the present disclosure, each protective sub side wall 1621 is provided with two adhesive dispensing holes 163, and the two adhesive dispensing holes 163 correspond to two inner side walls 1261 of the adhesive receiving groove 126, respectively, such that it is convenient for the user to dispense the adhesive to the two inner side walls 1261 of the adhesive receiving groove 126 simultaneously, thus improving the speed of dispensing the adhesive. Further, the inner side wall 1261 of the adhesive receiving groove 126 is obliquely connected between an inner bottom wall 1262 of the adhesive receiving groove 126 and the outer face of the lens-barrel side wall 122, and "obliquely connected" refers to that the inner side wall 1261 is not perpendicular to the inner bottom wall 1262, and the inner side wall 1261 is also not perpendicular to the outer face of the lens-barrel side wall 122. When the adhesive is injected to the inner side wall 1261, under the guidance of the inner wall 1261, the adhesive tends to flow to a middle portion of the adhesive receiving groove 126, thus accelerating the speed at which the adhesive fills the adhesive receiving groove 126.

The structured light projector in the related art generally adopts a vertical cavity surface emitting laser (VCSEL) as a light source, while a local irrelevance of the arrangement of the light-emitting elements in VCSEL needs to be further improved. In the electronic device 1000 according to the embodiments of the present disclosure, the common area B is arranged in the at least three basic sub-areas a and also within the additional area C, such that the additional area C intersects with the at least three basic sub-areas a. That is, the additional array 134 overlaps the at least three basic sub-arrays 1331, so as to provide more types of arrangements of the light-emitting elements 132, thus improving the local irrelevant of the array of the light-emitting elements 132.

In addition, since the protective cover 16 is joined with the lens barrel 12, the protective top wall 161 of the protective cover 16 limits the position of the diffractive optical element 15 together with the position limiting protrusion 123, such that the diffractive optical element 15 will not fall off along a light emitting direction, so as to prevent the laser from being emitting out without passing through the diffractive optical element 15, thus protecting the user and improving the safety.

As illustrated in FIG. 11, in some embodiments, the additional array 134 and each basic sub-array 1331 may be separately driven to emit light. When a plurality of the additional arrays 134 are provided, the plurality of the additional arrays 134 may be driven uniformly or separately. Moreover, regarding whether the laser is emitted or not, the additional array 134 and the basic sub-array 1334 do not affect each other, and the different basic sub-arrays 1334 also do not affect each other. By controlling different combinations of the arrays to emit laser, the laser generator 13 can emit different laser patterns.

As illustrated in FIG. 11, in some embodiments, the light-emitting elements 132 of the basic sub-array 1331 are regularly distributed. In some other embodiments, the light-emitting elements 132 of the basic sub-array 1331 are irregularly distributed. In still some other embodiments, among the plurality of basic sub-arrays 1331, some basic sub-arrays 1331 have the light-emitting elements 132 in a regular distribution, and other basic sub-arrays 1331 have the light-emitting elements 132 in an irregular distribution.

The regular distribution may be that the plurality of light-emitting elements 132 are arranged in crisscross rows and columns, and the rows and the columns form an array with a fixed angle. Or the plurality of light-emitting elements 132 are arranged in a radial array surrounding a certain point which serves as a center. Or, the plurality of light-emitting elements 132 are arranged in any distribution with certain regularity, such as a distribution with equal spacing along a predetermined direction, which is not limited herein. It may be understood that manufacturing the plurality of light-emitting elements 132 in the regular distribution on the substrate 131 can greatly improve the manufacturing efficiency. Therefore, when the light-emitting elements of the basic sub-array 1331 are regularly distributed, the manufacturing efficiency of the basic sub-array 1331 is relatively high. Of course, when the light-emitting elements 132 of the basic sub-array 1331 are irregularly distributed, the local irrelevance of the light-emitting elements 132 of the basic sub-array 1331 is relatively high.

As illustrated in FIG. 11, in some embodiments, the at least three basic sub-arrays 1331 are identical, and the additional array 134 is the same with the basic sub-array 1331. That is, the basic sub-array 1331 is the same with the additional array 134. When the array of the light-emitting elements 132 is manufactured, only an arrangement pattern of the light-emitting elements 132 in one basic sub-array 1331 needs to be designed, and the rest basic sub-arrays 1331 and the additional array 134 may be manufactured with the same arrangement pattern, thus saving the design cost and improving the manufacturing efficiency.

As illustrated in FIG. 13, in some embodiments, the at least three basic sub-arrays 1331 are identical. The additional arrays 134, 1341, 1342 and 1343 are generated by the basic sub-array 1331 by means of transformation, and the transformation includes one of rotation, mirror and zoom or a combination of more than one of rotation, mirror and zoom. In some embodiments, as illustrated in FIG. 13, the additional array 1341 may be generated by the basic sub-array 1331 by means of rotation, the additional array 1342 may be generated by the basic sub-array 1331 by means of mirror, and the additional array 1343 may be generated by the basic sub-array 1331 by means of zoom. After the additional arrays 134, 1341, 1342 and 1343 obtained by means of different transformation manners overlap the basic sub-arrays 1331, different arrays of light-emitting elements 132 may be generated, thus improving the local irrelevance of the array of the light-emitting elements 132. A rotation angle in the rotation transformation, a symmetry axis in the mirror transformation and a zoom factor in the zoom transformation may be selected according to a demand of an actual production. Of course, an additional array 134 may also be generated by the basic sub-array 1331 by means of a combination of a plurality of transformation manners. For example, the basic sub-array 1331 may be mirrored and then rotated to generate an additional array 134, or the basic sub-array 1331 may be zoomed, then rotated, and finally mirrored to generate an additional array 134, etc., which is not limited herein. As such, the additional arrays 134, 1341, 1342 and 1343 may be generated by the basic sub-array 1331 by means of transformation, and do not need to be redesigned, thus saving a certain design cost and allowing the array of light-emitting elements 132 to have a relatively high local irrelevance.

In some embodiments, the at least three basic sub-arrays 1331 and the additional array 134 may be generated by any one of the at least three basic sub-arrays 1331 by means of transformation, and the transformation includes one of rotation, mirror, and zoom or a combination of more than one of rotation, mirror, and zoom. In this case, any two basic sub-arrays 1331 may be mutually transformed to be obtained by means of one or more of the above transformation manners, any two additional arrays 134 may be mutually transformed to be obtained by means of one or more of the above transformation manners, and any one basic sub-array 1331 and any one additional array 134 may be mutually transformed to be obtained by means of one or more of the above transformation manners. For example, in the example illustrated in FIG. 14, the basic sub-array 1332 and the basic sub-array 1333 may be obtained by the basic sub-array 1331 by means of mirror, the basic sub-array 1334 may be obtained by the basic sub-array 1331 by means of rotation, and the additional array 134 may be obtained by the basic sub-array 1331 by means of zoom. The arrangement of the light-emitting elements 132 in the basic array 133 has a high local irrelevance, as the plurality of basic sub-arrays 1331 are obtained by means of transformation. Then, the additional array 134 overlaps the basic sub-arrays 1331 to further improve the local irrelevance of the array of the light-emitting elements 132. In addition, a pattern of one basic sub-array 1331 may be designed first, and then patterns of other rest basic sub-arrays 1331 and the additional array 134 can be obtained by one or more of the above transformation manners, such that the design difficulty is relatively low and the cost is saved.

As illustrated in FIGS. 8 to 10, in some embodiments, the protective cover 16 further includes an elastic first hook 164 protruding inwards from the protective side wall 162, and the lens barrel 12 further includes a second hook 127 protruding outwards from the lens-barrel side wall 122. When the protective cover 16 is covered on the lens barrel 12, the first hook 164 is engaged with the second hook 127 to prevent the protective cover 16 from falling off of the lens barrel 12.

In some embodiments, the second hook 127 may protrude outwards from an inner bottom wall 1262 of the adhesive receiving groove 126. The position of the first hook 164 corresponds to that of the second hook 127. In the process of covering the protective cover 16 on the lens barrel 12, the first hook 164 abuts against the second hook 127 and elastically deforms. When the protective cover 16 is mounted in place, the first hook 164 and the second hook 127 are engaged with each other along with a tactile feedback and a "click" of the engagement in place. As such, the joint of the protective cover 16 and the lens barrel 12 is reliable, and before the protective cover 16 and the lens barrel 12 are bonded by adhesive, the first hook 164 and the second hook 127 may be engaged with each other first, so as to effectively fix a relative position of the protective cover 16 and the lens barrel 12, thus facilitating the adhesive dispensing.

As illustrated in FIGS. 8 to 10, in some embodiments, each protective sub side wall 1621 is provided with the first hook 164. Correspondingly, each of the adhesive receiving grooves 126 is also provided with the second hook 127, the position of the second hook 127 corresponds to that of the first hook 164, and the first hooks 164 are engaged with the corresponding second hooks 127 simultaneously, such that the joint of the protective cover 16 and the lens barrel 12 is reliable. In some embodiments, the first hook 164 may correspond to a middle portion of the protective sub side wall 1621, and the second hook 127 may correspond to a middle portion of the adhesive receiving groove 126. When each protective sub side wall 1621 is provided with at least two adhesive dispensing holes 163, the first hook 164 is arranged between the at least two adhesive dispensing holes 163. More in some embodiments, the at least two adhesive dispensing holes 163 in each protective sub side wall 1621 are symmetrically distributed with respect to the first hook 164. As such, it is convenient for the adhesive to flow on two sides of the first hook 164 and the second hook 127, respectively, and the amount of the adhesive on the two sides is equivalent, such that the adhesive force is relatively uniform.

As illustrated in FIGS. 8 and 10, in some embodiments, the protective side wall 162 is provided with a relief hole 165 in a position corresponding to the first hook 164. In the process of covering the protective cover 16 on the lens barrel 12, when the first hook 164 abuts against the second hook 127 and elastically deforms, the relief hole 165 provides a deformation space for the elastic deformation of the first hook 164. That is, the first hook 164 elastically deforms and extends into the relief hole 165. In some embodiments, when the first hook 164 abuts against the second hook 127, the first hook 164 elastically deforms outwards, and extends into the relief hole 165 to avoid a motion interference with the protective side wall 162. In addition, it is convenient for a user to observe the fit situation between the first hook 164 and the second hook 127 through the relief hole 165, for example, to judge whether all the first hooks 164 are engaged with the corresponding second hooks 127.

As illustrated in FIGS. 8 and 9, in some embodiments, the second hook 127 is provided with a guide inclined surface 1271. Along a direction that the protective cover 16 is sleeved onto the lens barrel 12, the guide inclined surface 1271 extends away from the inner bottom wall 1262. In the process of covering the protective cover 16 on the lens barrel 12, the first hook 164 abuts against the guide inclined surface 1271. Due to the inclination of the guide inclined surface 1271 with respect to the inner bottom wall 1262, in the fit process of the first hook 164 and the second hook 127, a abutting force of the second hook 127 on the first hook 164 increases slowly and continuously, the deformation of the first hook 164 also increases continuously, such that it is easy for the first hook 164 and the second hook 127 to engage with each other.

Reference throughout this specification to terms "certain embodiments" "an embodiment," "some embodiments," "an example embodiment," "an example", "a specific example," or "some examples," means that a particular feature, structure, material, or characteristic described in connection with the embodiment or example is included in at least one embodiment or example of the present disclosure. In this specification, example descriptions of aforesaid terms are not necessarily referring to the same embodiment or example. Moreover, the particular features, structures, materials, or characteristics described may be combined in any suitable manner in one or more embodiments or examples. Furthermore, in the case of non-contradiction, those skilled in the art may combine and group the different embodiments or examples described in this specification and the features of the different embodiments or examples.

In addition, terms such as "first" and "second" are used herein for purposes of description and are not intended to indicate or imply relative importance or significance or to imply the number of indicated technical features. Thus, the feature defined with "first" and "second" may comprise one or more of this feature. In the description of the present disclosure, "a plurality of" means at least two, such as two, three and so on, unless specified otherwise.

Although explanatory embodiments have been illustrated and described, it would be appreciated by those skilled in the art that the above embodiments are examples and cannot be construed to limit the present disclosure, and changes, modifications, alternatives and varieties can be made in the embodiments by those skilled in the art within the scope of the present disclosure. The scope of this disclosure is limited by the claims and their equivalents.

What is claimed is:

1. A laser generator, comprising:
   a substrate; and
   an array of light-emitting elements arranged on the substrate, the array of light-emitting elements comprising a basic array and an additional array added to the basic array, the basic array forming a basic area on the substrate, the additional array forming an additional area on the substrate,
   wherein the basic array comprises at least three basic sub-arrays, each basic sub-array forms a basic sub-area on the substrate, the basic area comprises a common area arranged in at least three basic sub-areas, and the common area is further arranged within the additional area,
   wherein the at least three basic sub-areas overlap one another, and the common area is configured as an overlapped part of the at least three basic sub-areas.

2. The laser generator according to claim 1, wherein the at least three basic sub-arrays are identical, and the additional array is the same with the basic sub-array.

3. The laser generator according to claim 1, wherein the at least three basic sub-arrays are identical, the additional array is generated by the basic sub-array through transformation, and the transformation comprises one of rotation, mirror and zoom or a combination of more than one of rotation, mirror and zoom.

4. The laser generator according to claim 1, wherein the at least three basic sub-arrays and the additional array are generated by any one of the at least three basic sub-arrays through transformation, and the transformation comprises one of rotation, mirror and zoom or a combination of more than one of rotation, mirror and zoom.

5. The laser generator according to claim 1, wherein the light-emitting elements of the basic sub-array are regularly or irregularly distributed.

6. The laser generator according to claim 1, wherein the additional array and each basic sub-arrays are separately driven to emit light.

7. The laser generator according to claim 1, wherein the common area is one of a point, a line and a plane.

8. A structured light projector, comprising:
   a base plate assembly;
   a laser generator arranged on the base plate assembly, the laser generator comprising:
      a substrate; and
      an array of light-emitting elements arranged on the substrate, the array of light-emitting elements comprising a basic array and an additional array added to the additional array, the basic array forming a basic area, the additional array forming an additional area, wherein the basic array comprises at least three basic sub-arrays, each basic sub-array forms a basic sub-area, the basic area comprises a common area arranged in at least three basic sub-areas, and the common area is further arranged within the additional area;
   a lens barrel comprising a lens-barrel side wall arranged on the base plate assembly and defining an accommodating chamber together with the base plate assembly;
   a collimation element accommodated in the accommodating chamber; and
   a diffractive optical element accommodated in the accommodating chamber, the laser generator being configured to emit laser into the accommodating chamber, and the collimation element and the diffractive optical element being sequentially arranged in a light path of the laser generator,
   wherein the lens barrel comprises a position limiting protrusion protruding from the lens-barrel side wall into the accommodating chamber, and the diffractive optical element is mounted on the position limiting protrusion,
   wherein the structured light projector further comprises a protective cover joined with the lens barrel, the protective cover comprises a protective top wall, and the diffractive optical element is arranged between the position limiting protrusion and the protective top wall,
   wherein the protective cover further comprises a protective side wall extending from the protective top wall, the protective cover covers the lens barrel, the protective side wall is fixedly connected with the lens-barrel side wall, an adhesive receiving groove is formed in an outer face of the lens-barrel side wall, and the protective side wall is provided with an adhesive dispensing hole in a position corresponding to the adhesive receiving groove.

9. The structured light projector according to claim 8, wherein the at least three basic sub-arrays are identical, and the additional array is the same with the basic sub-array.

10. The structured light projector according to claim 8, wherein the at least three basic sub-arrays are identical, the additional array is generated by the basic sub-array through transformation, and the transformation comprises one of rotation, mirror and zoom or a combination of more than one of rotation, mirror and zoom.

11. The structured light projector according to claim 8, wherein the at least three basic sub-arrays and the additional array are generated by any one of the at least three basic sub-arrays through transformation, and the transformation comprises one of rotation, mirror and zoom or a combination of more than one of rotation, mirror and zoom.

12. The structured light projector according to claim 8, wherein the light-emitting elements of the basic sub-array are regularly or irregularly distributed.

13. The structured light projector according to claim 8, wherein the additional array and each basic sub-array are separately driven to emit light.

14. The structured light projector according to claim 8, wherein the protective cover further comprises an elastic first hook protruding inwards from the protective side wall, the lens barrel further comprises a second hook protruding outwards from the lens-barrel side wall, and the first hook is configured to engage with the second hook when the protective cover is mounted on the lens barrel.

15. The structured light projector according to claim 14, wherein the protective side wall is provided with a relief hole in a position corresponding to the first hook, and the first hook is configured to abut against the second hook, elastically deform outwards, and extend into the relief hole when the protective cover is being mounted on the lens barrel.

16. An electronic device, comprising a housing and an image acquisition structure, the image acquisition structure being arranged in the housing and exposed out of the housing to acquire a depth image, the image acquisition structure comprising:
- a structured light projector configured to emit a laser pattern out;
- an image acquirer configured to acquire the laser pattern; and
- a processor connected with the structured light projector and the image acquirer, respectively, and configured to process the laser pattern to obtain a depth image;

wherein the structured light projector comprises a base plate assembly and a laser generator, the laser generator is arranged on the base plate assembly, and the laser generator comprises:
- a substrate; and
- an array of light-emitting elements arranged on the substrate, the array of light-emitting elements comprising a basic array and an additional array added to the basic array on the substrate, the basic array forming a basic area, the additional array forming an additional area on the substrate, wherein the basic array comprises at least three basic sub-arrays, each basic sub-array forms a basic sub-area, the basic area comprises a common area arranged in at least three basic sub-areas, and the common area being further arranged within the additional area, wherein the at least three basic sub-areas overlap one another, and the common area is configured as an overlapped part of the at least three basic sub-areas.

* * * * *